(12) United States Patent
Lin et al.

(10) Patent No.: US 11,374,382 B2
(45) Date of Patent: Jun. 28, 2022

(54) METHOD FOR INCREASING EAM BANDWIDTH, COMPONENT STRUCTURE AND MANUFACTURING PROCESS THEREOF USING PLURAL P-I-N WAVEGUIDES SERIALLY CONNECTED BY HIGH-IMPEDANCE TRANSMISSION LINES

(71) Applicant: LuxNet Corporation, Taoyuan (TW)

(72) Inventors: Fang-Jeng Lin, Taoyuan (TW);
Yu-Chun Fan, Taoyuan (TW);
Pi-Cheng Law, Taoyuan (TW);
Yi-Ching Chiu, Taoyuan (TW)

(73) Assignee: LUXNET CORPORATION, Taoyuan (TW)

( * ) Notice: Subject to any disclaimer, the term of this patent is extended or adjusted under 35 U.S.C. 154(b) by 267 days.

(21) Appl. No.: 16/903,159

(22) Filed: Jun. 16, 2020

(65) Prior Publication Data
US 2021/0296850 A1  Sep. 23, 2021

(30) Foreign Application Priority Data

Mar. 23, 2020  (TW) ................................ 109109657

(51) Int. Cl.
| *H01S 5/026* | (2006.01) |
| --- | --- |
| *H01S 5/06* | (2006.01) |
| *H01S 5/20* | (2006.01) |
| *H01S 5/028* | (2006.01) |
| *G02F 1/015* | (2006.01) |
| *G02F 1/01* | (2006.01) |
| *G02F 1/025* | (2006.01) |

(52) U.S. Cl.
CPC ............ *H01S 5/0265* (2013.01); *G02F 1/011* (2013.01); *G02F 1/0123* (2013.01); *G02F 1/0155* (2021.01); *G02F 1/0157* (2021.01); *G02F 1/025* (2013.01); *H01S 5/0285* (2013.01); *H01S 5/0609* (2013.01); *H01S 5/2018* (2013.01)

(58) Field of Classification Search
CPC .... H01S 5/0265; H01S 5/0285; H01S 5/0609; H01S 5/2018; G02F 1/011; G02F 1/0123; G02F 1/0155; G02F 1/0157; G02F 1/025; G02F 1/0121
See application file for complete search history.

(56) References Cited

U.S. PATENT DOCUMENTS

| 8,958,664 | B2 * | 2/2015 | Kono | ..................... B82Y 20/00 |
| --- | --- | --- | --- | --- |
| | | | | 257/E33.001 |
| 2003/0067675 | A1 * | 4/2003 | Wang | ........................ H01S 5/50 |
| | | | | 359/344 |

(Continued)

*Primary Examiner* — Andrew Jordan
(74) *Attorney, Agent, or Firm* — WPAT, PC

(57) ABSTRACT

A method for increasing the bandwidth of an electroabsorption modulator (EAM) includes the following steps. First, a plurality of p-i-n active waveguides for the EAM are defined on a p-i-n optical waveguide forming an EAM having a shorter p-i-n active waveguide length. Then, the bandwidth of the EAM can be increased. Second, the high-impedance transmission lines are used in series to connect the EAM sections to reduce the microwave reflection and then increase the device bandwidth. Finally, the impedance-controlled transmission lines for the signal input and output can not only reduce the parasitic effects resulting from packaging, but also reduce the microwave reflection resulting from the impedance mismatch at the device input and load.

12 Claims, 7 Drawing Sheets

(56) References Cited

U.S. PATENT DOCUMENTS

2013/0230268 A1* 9/2013 Kono .................... B82Y 20/00
                                                    385/2
2021/0296850 A1* 9/2021 Lin ...................... H01S 5/0265

* cited by examiner

METHOD FOR INCREASING EAM BANDWIDTH, COMPONENT STRUCTURE AND MANUFACTURING PROCESS THEREOF USING PLURAL P-I-N WAVEGUIDES SERIALLY CONNECTED BY HIGH-IMPEDANCE TRANSMISSION LINES

CROSS REFERENCE TO RELATED APPLICATION

The application is based on, and claims priority from, Taiwan Application Serial Number 109109657, filed on Mar. 23, 2020, the disclosure of which is hereby incorporated by reference herein in its entirety.

TECHNICAL FIELD

The invention relates to an electroabsorption modulator, in particular to a method for increasing the bandwidth of an electroabsorption modulator and the bandwidth of an electroabsorption modulator laser.

BACKGROUND

Generally, the bandwidth of an electroabsorption modulator (EAM) or an electroabsorption modulator laser (EML) is limited by the length of the electroabsorption modulator, and the large impedance mismatch between the EAM (~20Ω) and the source (50Ω) and the load (50Ω). On the other hand, the length of the gold wire after packaging causes high parasitic inductance. FIG. 1 is a schematic diagram showing a conventional electroabsorption modulator laser device. As shown in FIG. 1, an electroabsorption modulation laser device 2 includes an electroabsorption modulator 3 and a laser diode 4. The electroabsorption modulator 3 has a p-i-n optical waveguide 5, a p-i-n active waveguide 6, a wire bonding pad 7, and packaged gold wires 8 and 9. FIG. 2 is a circuit diagram of a conventional electroabsorption modulator laser device. As shown in FIG. 2, Z6 is the impedance of the electroabsorption modulator 6, and Z8 and Z9 are the impedances generated after packaging. ZS is the input impedance of 50 ohms, and ZL is the load impedance of 50 ohms.

In order to increase the bandwidth of the components, it is often necessary to modify from the wafer growth process to shorten the length of the EAM section. At the same time, the conventional structure on the package will cause difficulties in the package of the device, and the problem of unsolvable high parasitic inductance is prone to occur.

SUMMARY

The invention discloses a segmental p-i-n active waveguide structure for an electroabsorption modulator. These segmented p-i-n active waveguides are formed by defining a plurality of metal electrodes on the p-i-n optical waveguide for electroabsorption modulator formed during the wafer etching and regrowth process. This electroabsorption modulator with segmented p-i-n active waveguides then has a shorter length and therefore a higher bandwidth. Each p-i-n active waveguide of the electroabsorption modulator is connected with a high-impedance transmission line. In addition to providing a complete transmission path of the signal, by connecting the high-impedance transmission lines with the low-impedance p-i-n active waveguide in a periodic structure, the microwave reflection can be reduced resulting in higher component bandwidth. Two transmission lines are used to connect the electroabsorption modulator and the two wire bonding pads. The two transmission lines are used to further reduce the microwave reflection by controlling their impedances and lengths. The two transmission lines at the input and output of electroabsorption modulator are used to shorten the lengths of the bonding wires and hence reduce the parasitic inductance after device packaging. Two wire bonding pads are used for the bonding of the two gold wires connecting electroabsorption modulator to 50-ohm transmission line and 50-ohm load termination on a submount carrier.

An objective of the disclosure is to provide a method for increasing electroabsorption modulator (EAM) bandwidth. The disclosure does not need to go through a new wafer etching and growth process to shorten the length of the p-i-n active waveguide of the electroabsorption modulator to increase the frequency bandwidth of the electroabsorption modulator laser device.

The disclosure provides a method for increasing the bandwidth of an electroabsorption modulator (EAM) includes the following steps. First, several p-i-n active waveguides are defined by a plurality of electrodes on a p-i-n optical waveguide, forming an electroabsorption modulator having a shorter active waveguide length. Therefore, the device bandwidth can be increased. Second, the high-impedance transmission lines are used in series to connect the p-i-n active waveguide sections to reduce the microwave reflection and then increase the device bandwidth. Finally, the impedance-controlled transmission lines at the input and output of electroabsorption modulator are used not only to shorten the length of the gold wires to reduce the parasitic inductance, but also to reduce the microwave reflection at the input and output of the electroabsorption modulator due to impedance mismatch.

Compared with the conventional electroabsorption modulator laser device, the present invention has the following advantages.

1. The electroabsorption modulator consists of several low-impedance p-i-n active waveguides connected in series with high-impedance transmission lines. By connecting high-low impedances in series, the bandwidth of the components is increased by reducing the reflection of microwaves.
2. Impedance-controlled transmission lines are formed at both ends of the electroabsorption modulator as the input and output of the microwave signal, so that the length of the gold wire of the package can be shortened. Due to the reduction in parasitic inductance, the bandwidth after component packaging can also be increased.
3. The invention does not need to go through a new wafer etching and regrowth process to shorten the length of the electroabsorption modulator to increase the frequency bandwidth of the electroabsorption modulator laser device, as long as the original electroabsorption modulator p-i-n optical waveguide is segmented into several p-i-n active waveguides on the original wafer.

DETAILED DESCRIPTION

The disclosed embodiments are a method for increasing electroabsorption modulator (EAM) bandwidth, a component structure and a manufacturing process thereof. The disclosure does not need to go through a new wafer etching and regrowth process to shorten the length of the electroabsorption modulator to increase the frequency bandwidth of the electroabsorption modulator laser device.

Figure 1:
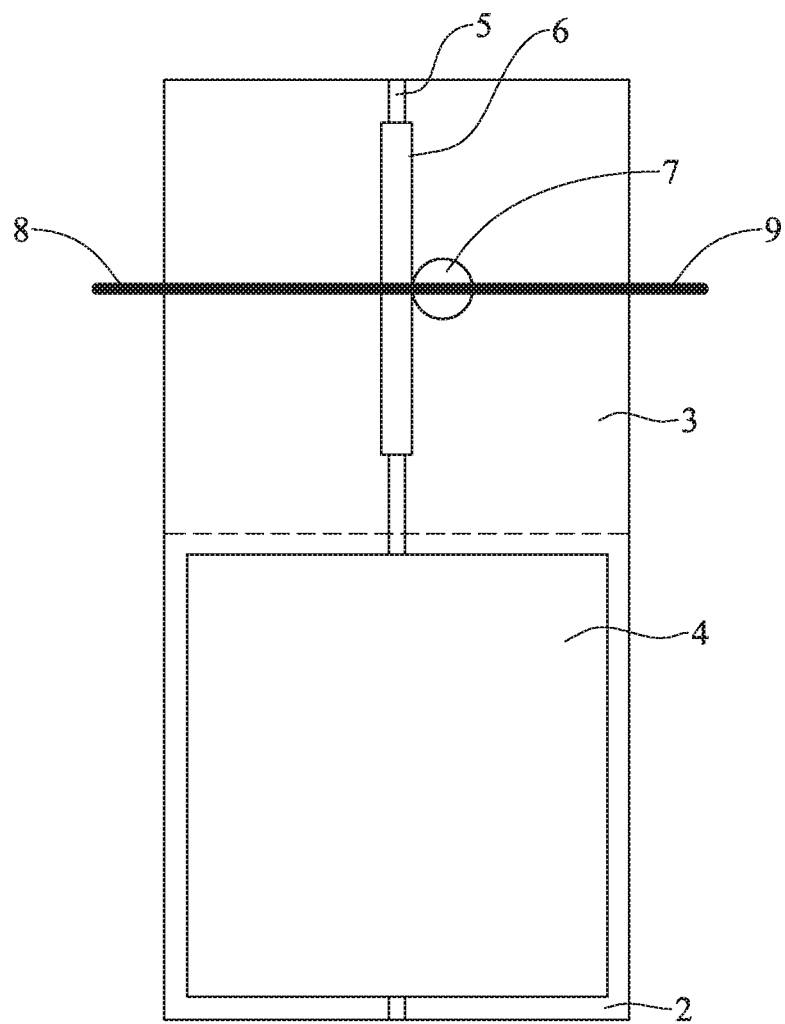
FIG. 1 is a schematic diagram showing a conventional electroabsorption modulator laser device.
Figure 2:
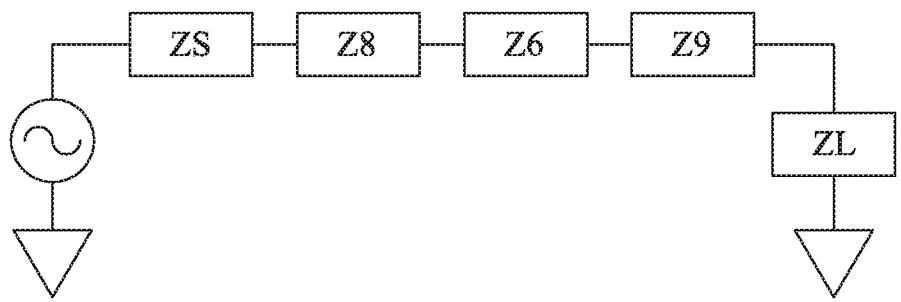
FIG. 2 is a circuit diagram of a conventional electroabsorption modulator laser device.
Figure 3:
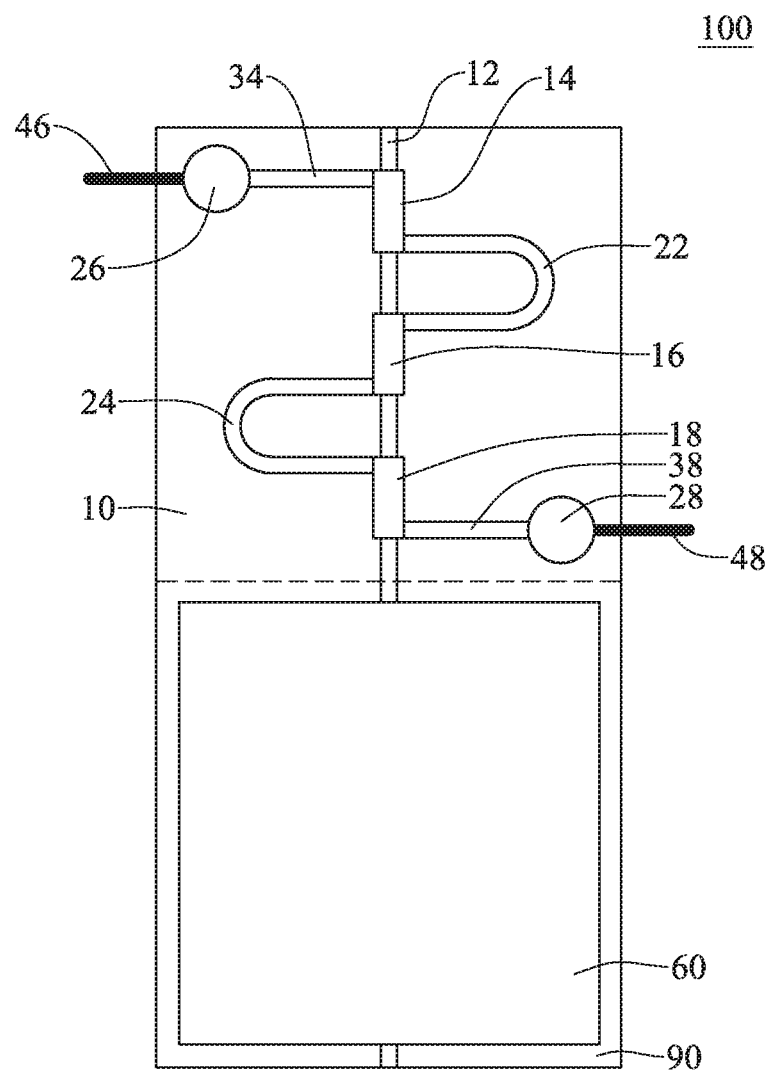
FIG. 3 is a schematic diagram showing the component structure for increasing the bandwidth of an electroabsorption modulator of the disclosure.

Embodiment 1: FIG. 3 is a schematic diagram showing the component structure for increasing the bandwidth of an electroabsorption modulator of the disclosure. As shown in FIG. 3, an electroabsorption modulator 10 has a p-i-n (intrinsic region in between the n- and p-doped) optical waveguide 12. The electroabsorption modulator 10 is formed on a semiconductor substrate 100. The semiconductor substrate 100 is an III-V semiconductor including gallium arsenide GaAs, indium phosphide InP, or gallium nitride GaN. The material constituting the p-i-n optical waveguide 12 includes indium gallium arsenide phosphide (InGaAsP) or indium gallium arsenide (InGaAlAs).

The p-i-n optical waveguide 12 has a plurality of p-i-n active waveguides 14, 16 and 18 for the electroabsorption modulator 10. A method for forming the plurality of p-i-n active waveguides is to use a lithography process to pattern the electrodes of the electroabsorption modulator. Then, a gold thin film is deposited to form the p-i-n active waveguides 14, 16 and 18 for the electroabsorption modulator with a vacuum depositing process. High-impedance transmission lines (HZTML) 22 and 24 are used in series to connect the p-i-n active waveguides to form the electroabsorption modulator. The bandwidth of the electroabsorption modulator 10 is increased by reducing microwave reflection after using the High-impedance transmission lines (HZTML) 22 and 24 in series to connect the p-i-n active waveguides of the electroabsorption modulator. One end of the electroabsorption modulator 14 is electrically connected to a wire bonding pad 26 via an output impedance-controlled transmission line 34, and one end of the electroabsorption modulator 18 is electrically connected to a wire bonding pad 28 via an input impedance-controlled transmission line 38. The output impedance-controlled transmission line 34 and the input impedance-controlled transmission line 38 can also be used to reduce microwave reflections. The values of the lengths- and impedance of the impedance-controlled transmission 34 and 38 are designed to reduce the microwave reflections.

The wire bonding pads 26 and 28 are electrically connected to a 50-ohm load termination and a 50-ohm transmission line on a submount carrier respectively through the gold wires 46 and 48.

A laser diode 60 is integrated with the electroabsorption modulator 10 into one electroabsorption modulator laser device 90. The laser diode 60 includes a Distributed Feedback Laser (DFB Laser) or a Distributed Bragg reflector Laser (DBR Laser).

Figure 4:
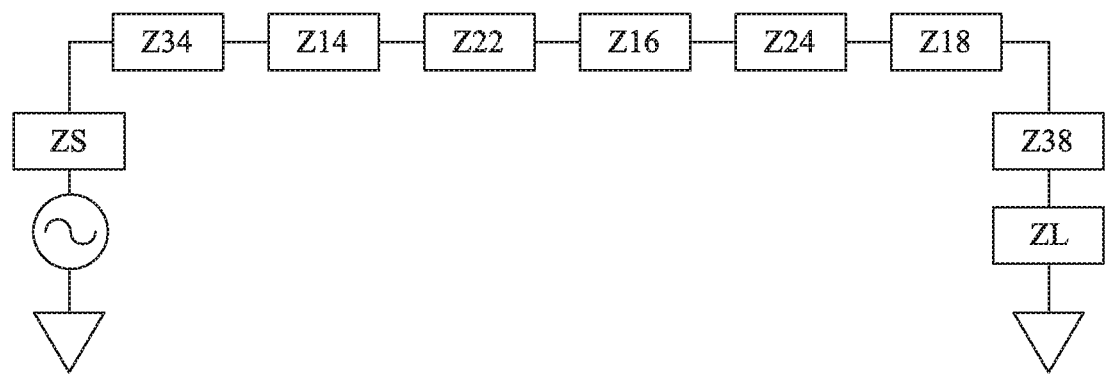
FIG. 4 is a circuit diagram of a component structure for increasing the bandwidth of an electroabsorption modulator of the disclosure.

FIG. 4 is a circuit diagram of a component structure for increasing the bandwidth of an electroabsorption modulator of the present invention. As shown in FIGS. 4, Z14, Z16, and Z18 are, respectively, the impedances of the p-i-n active waveguides 14, 16, and 18 of the electroabsorption modulator 10. Z22 and Z24 are the high-impedance transmission lines 22 and 24, respectively. Z34 is the impedance of the output impedance-controlled transmission line 34. Z38 is the impedance of the input impedance-controlled transmission line 38. ZS is the impedance of the transmission line on a submount carrier or a signal source which is usually 50 ohms, and ZL is the on-submount load impedance of 50 ohms.

Figure 5:
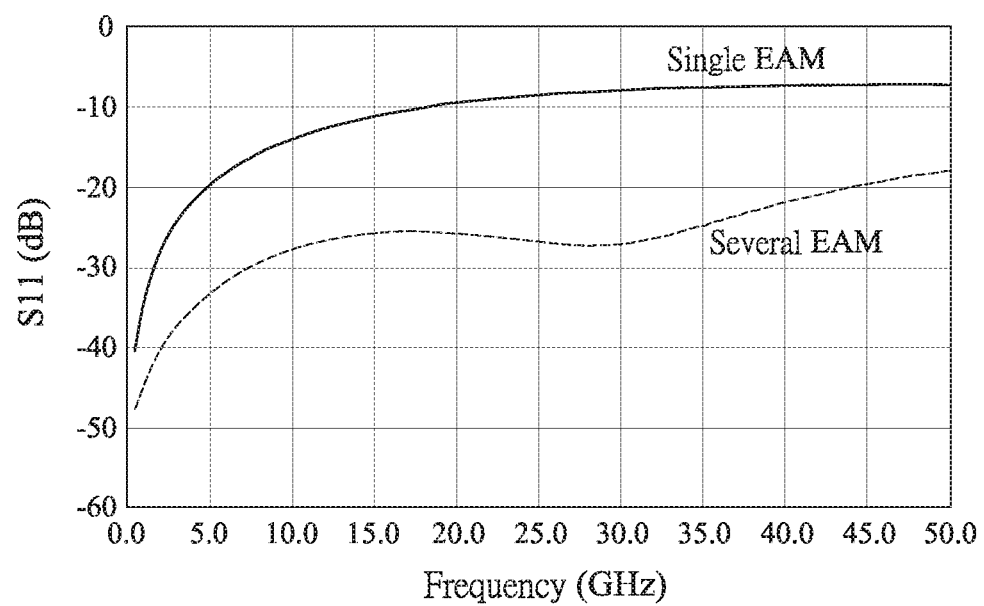
FIG. 5 is the S11 return loss diagram.

FIG. 5 is the S11 return loss diagram. As shown in FIG. 5, the upper curve represents the return loss diagram of the conventional electroabsorption modulator laser device, and the lower curve represents the return loss diagram of the electroabsorption modulator laser device of the present invention. The measurement results of the return loss show that the present invention can reduce the microwave reflection by using the high-impedance transmission lines 22 and 24 in series with the p-i-n active waveguides 14, 16, 18 and adding the output impedance-controlled transmission line 34 and the input impedance-controlled transmission line 38.

Figure 6:
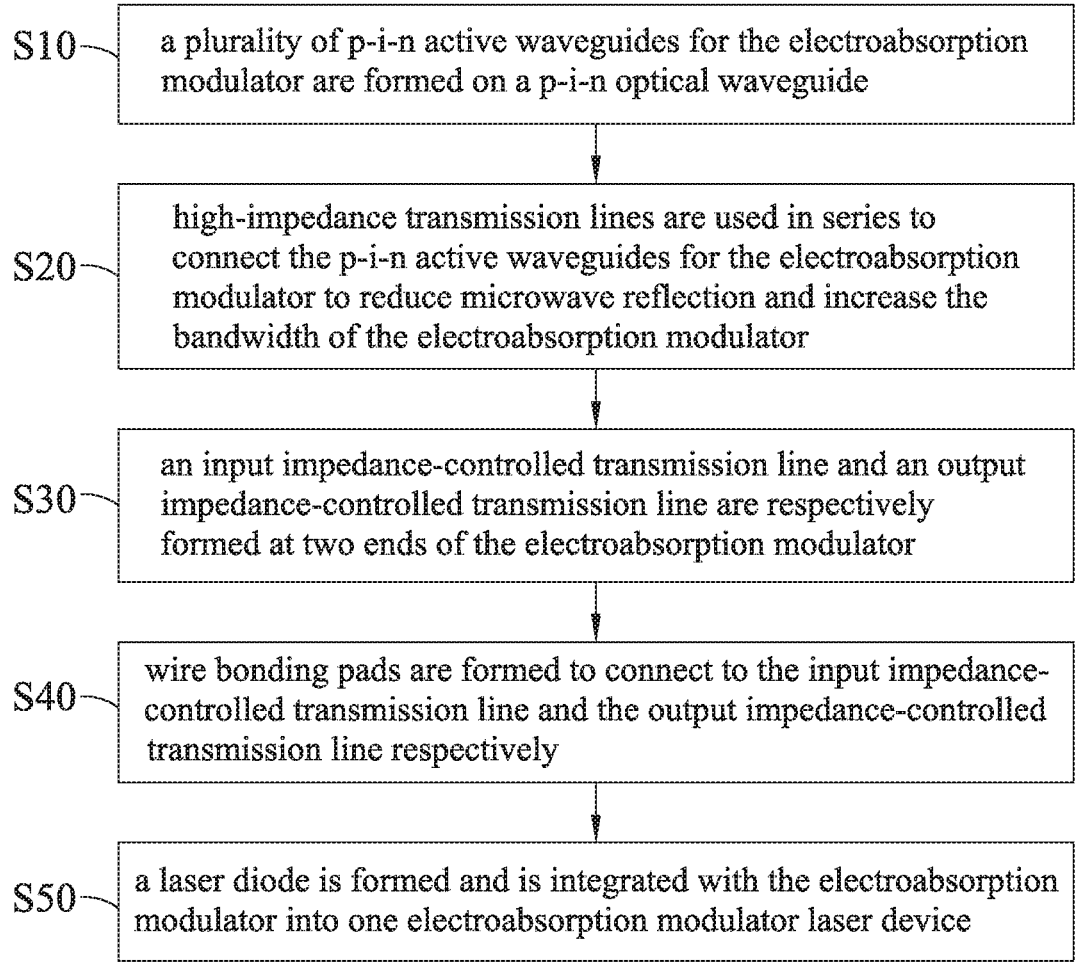
FIG. 6 is a flowchart of a method for increasing the bandwidth of an electroabsorption modulator of the disclosure.

Embodiment 2: FIG. 6 is a flowchart of a method for increasing the bandwidth of an electroabsorption modulator of the disclosure. As shown in FIG. 6, first, a plurality of p-i-n active waveguides for the electroabsorption modulator are formed on a p-i-n optical waveguide, as shown in step S10. Next, high-impedance transmission lines are used in series to connect the p-i-n active waveguides for the electroabsorption modulator to reduce microwave reflection and increase the bandwidth of the electroabsorption modulator, as shown in step S20. Next, an input impedance-controlled transmission line and an output impedance-controlled transmission line are respectively formed at two ends of the electroabsorption modulator, as shown in step S30. Next, wire bonding pads are formed to connect to the input impedance-controlled transmission line and the output impedance-controlled transmission line respectively, as shown in step S40. Finally, a laser diode is formed and is integrated with the electroabsorption modulator into one electroabsorption modulator laser device, as shown in step S50.

Figure 7:
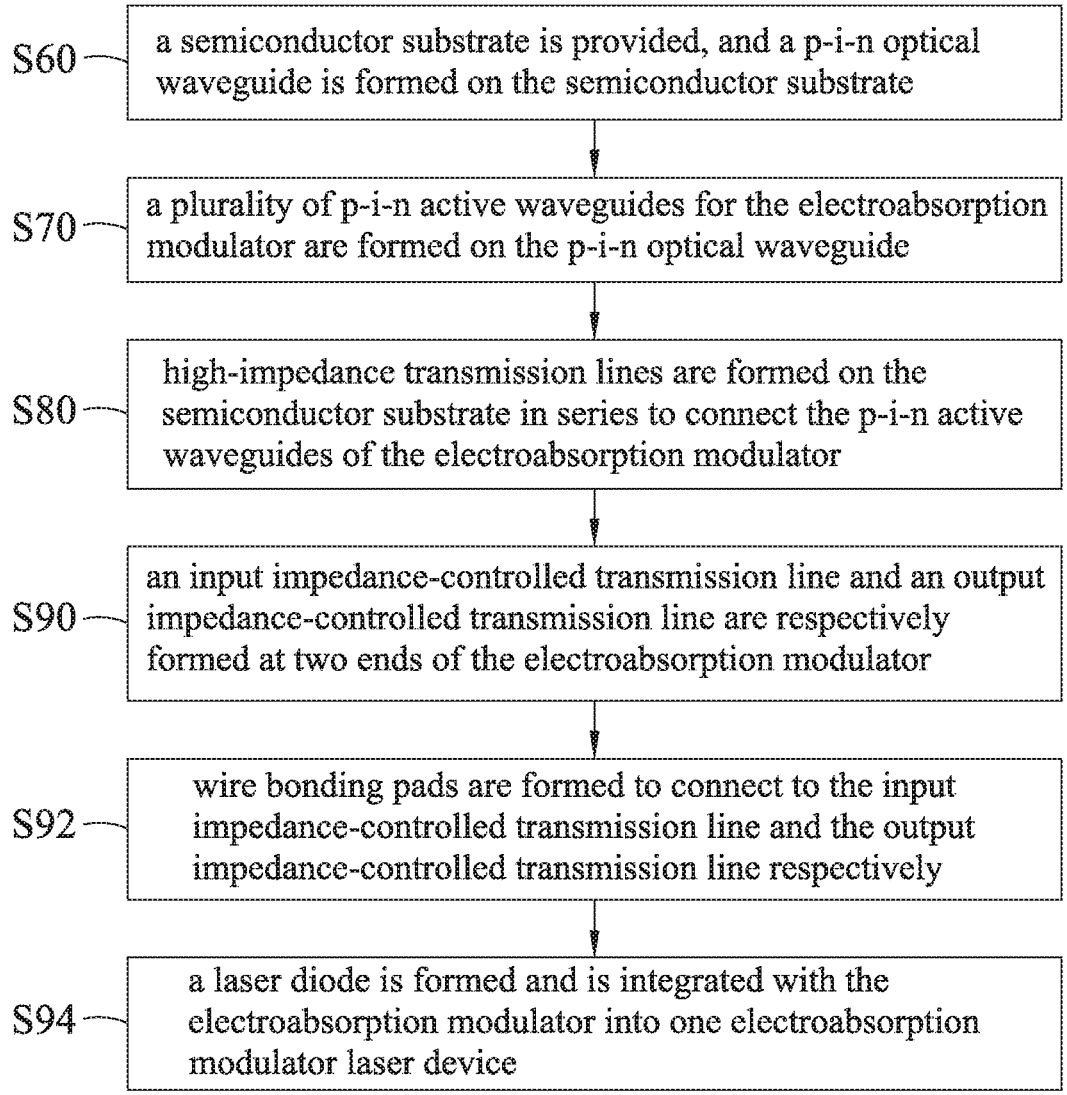
FIG. 7 is a flowchart of a manufacturing process of an electroabsorption modulator for increasing the bandwidth of the electroabsorption modulator of the disclosure.

Embodiment 3: FIG. 7 is a flowchart of a manufacturing process of an electroabsorption modulator for increasing the bandwidth of the electroabsorption modulator of the disclosure. There is no specific sequence for the steps of the process for implementing the electroabsorption modulator for increasing the bandwidth of an electroabsorption modulator of the present invention, and the sequence of the steps is arranged only to explain the process of the present invention in detail. As shown in FIG. 7, first, a semiconductor substrate is provided, and a p-i-n optical waveguide is formed on the semiconductor substrate, as shown in step S60. Next, a plurality of p-i-n active waveguides for the electroabsorption modulator are formed on the p-i-n optical waveguide, as shown in step S70. Next, high-impedance transmission lines are formed on the semiconductor substrate in series to connect the p-i-n active waveguides of the electroabsorption modulator, as shown in step S80. Next, an input impedance-controlled transmission line and an output impedance-controlled transmission line are respectively formed at two ends of the electroabsorption modulator, as shown in step S90. Next, wire bonding pads are formed to connect to the input impedance-controlled transmission line and the output impedance-controlled transmission line respectively, as shown in step 92. Finally, a laser diode is formed and is integrated with the electroabsorption modulator into one electroabsorption modulator laser device, as shown in step S94. The component structure for increasing the bandwidth of an electroabsorption modulator of Embodiment 1 can be manufactured by using the process of Embodiment 3.

What is claimed is:

1. A method for increasing the bandwidth of an electroabsorption modulator (EAM), comprising the steps of:
    forming a plurality of p-i-n active waveguides for the electroabsorption modulator on a p-i-n optical waveguide; and
    using high-impedance transmission lines in series to connect the p-i-n active waveguides of the electroabsorption modulator to reduce microwave reflection and increase the bandwidth of the electroabsorption modulator.

2. The method for increasing the bandwidth of an electroabsorption modulator as recited in claim 1, further comprising the steps of:
    forming an input impedance-controlled transmission line and an output impedance-controlled transmission line respectively; and
    using the input impedance-controlled transmission line and the output impedance-controlled transmission line to reduce the microwave reflection and the lengths of bonding wires and increase the bandwidth of the electroabsorption modulator.

3. The method for increasing the bandwidth of an electroabsorption modulator as recited in claim 1, further comprising a step of forming a laser diode and integrating the electroabsorption modulator into one electroabsorption modulator laser device, wherein the laser diode includes a Distributed Feedback Laser (DFB Laser) or a Distributed Bragg reflector Laser (DBR Laser).

4. The method for increasing the bandwidth of an electroabsorption modulator as recited in claim 1, wherein forming the plurality of the p-i-n active waveguide for the electroabsorption modulator is to use a lithography process to define an electroabsorption modulator having a shorter p-i-n active waveguide length resulting in the increase of the bandwidth of the electroabsorption modulator.

5. A component structure for increasing the bandwidth of an electroabsorption modulator, comprising:
    a p-i-n optical waveguide, formed on the electroabsorption modulator, the p-i-n optical waveguide having a plurality of the p-i-n active waveguides of the electroabsorption modulator;
    high-impedance transmission lines, used in series to connect the p-i-n active waveguides of the electroabsorption modulator to reduce microwave reflection and increase the bandwidth of the electroabsorption modulator; and
    an input impedance-controlled transmission line and an output impedance-controlled transmission line, formed respectively at two ends of the electroabsorption modulator.

6. A component structure for increasing the bandwidth of an electroabsorption modulator as recited in claim 5, further comprising two wire bonding pads, connected to the input impedance-controlled transmission line and the output impedance-controlled transmission line.

7. A component structure for increasing the bandwidth of an electroabsorption modulator as recited in claim 5, further comprising a laser diode, integrated the electroabsorption modulator into one electroabsorption modulator laser device, wherein the laser diode includes a DFB Laser or a DBR Laser.

8. A component structure for increasing the bandwidth of an electroabsorption modulator as recited in claim 5, wherein the plurality of the p-i-n active waveguides for the electroabsorption modulator are formed by using a lithography process to define an electroabsorption modulator having a shorter p-i-n active waveguide length resulting in the increase of the bandwidth of the electroabsorption modulator.

9. A manufacturing process of an electroabsorption modulator for increasing the bandwidth of the electroabsorption modulator, comprising the steps of:
    providing a semiconductor substrate, and forming a p-i-n optical waveguide on the semiconductor substrate;
    forming a plurality of p-i-n active waveguides for the electroabsorption modulator on the p-i-n optical waveguide;
    forming high-impedance transmission lines on the semiconductor substrate in series to connect the p-i-n active waveguides of the electroabsorption modulator; and
    forming an input impedance-controlled transmission line and an output impedance-controlled transmission line, respectively at two ends of the electroabsorption modulator.

10. The manufacturing process of an electroabsorption modulator for increasing the bandwidth the an electroabsorption modulator as recited in claim 9, further comprising a step of forming wire bonding pads connected to the input impedance-controlled transmission line and the output impedance-controlled transmission line respectively.

11. The manufacturing process of an electroabsorption modulator for increasing the bandwidth of the electroabsorption modulator as recited in claim 9, further comprising a step of forming a laser diode and integrating the electroabsorption modulator into one electroabsorption modulator laser device, wherein the laser diode includes a DFB Laser or a DBR Laser.

12. The manufacturing process of an electroabsorption modulator for increasing the bandwidth of the electroabsorption modulator as recited in claim 9, wherein forming the plurality of p-i-n active waveguides for the electroabsorption modulator is to use a lithography process to define an electroabsorption modulator having a shorter p-i-n active waveguide length resulting in the increase of the bandwidth of the electroabsorption modulator.

\* \* \* \* \*